US006476399B1

(12) United States Patent
Harrington et al.

(10) Patent No.: US 6,476,399 B1
(45) Date of Patent: Nov. 5, 2002

(54) SYSTEM AND METHOD FOR REMOVING CONTAMINANT PARTICLES RELATIVE TO AN ION BEAM

(75) Inventors: Eric R. Harrington, Ipswich, MA (US); Victor M. Benveniste, Gloucester, MA (US); Michael A. Graf, Cambridge, MA (US); Robert D. Rathmell, Exeter, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 222 days.

(21) Appl. No.: 09/654,379

(22) Filed: Sep. 1, 2000

(51) Int. Cl.[7] .................................................. H01J 37/30
(52) U.S. Cl. ................... 250/452.21; 200/252; 200/398
(58) Field of Search ........................... 250/251, 492.21, 250/398

(56) References Cited

U.S. PATENT DOCUMENTS

| 4,683,922 A | | 8/1987 | Harrison et al. |
| 4,825,087 A | * | 4/1989 | Renau et al. ............ 250/492.2 |
| 5,134,299 A | | 7/1992 | Denholm |
| 5,384,465 A | * | 1/1995 | Armour et al. ........ 250/492.21 |
| 5,399,871 A | | 3/1995 | Ito et al. |
| 5,466,929 A | * | 11/1995 | Sakai et al. .................. 250/251 |
| 5,656,092 A | | 8/1997 | Blake et al. |
| 5,670,217 A | | 9/1997 | Blake et al. |
| 5,703,375 A | * | 12/1997 | Chen et al. ............ 250/492.21 |
| 5,932,882 A | * | 8/1999 | England et al. ........ 250/492.21 |
| 6,100,536 A | * | 8/2000 | Ito et al. ................ 250/492.21 |
| 6,177,679 B1 | * | 1/2001 | Byun et al. ............ 250/492.21 |
| 6,242,750 B1 | * | 6/2001 | Takahashi et al. |
| 6,359,286 B1 | * | 3/2002 | Ito et al. ................ 250/492.21 |

* cited by examiner

Primary Examiner—Bruce Anderson
(74) Attorney, Agent, or Firm—Eschweiler & Associates, LLC (57) ABSTRACT

A system for inhibiting the transport of contaminant particles with an ion beam includes a particle charging system for charging particles within a region through which the ion beam travels. An electric field is generated downstream relative to the charged region so as to urge charged particles away from a direction of travel for the ion beam.

23 Claims, 5 Drawing Sheets

SYSTEM AND METHOD FOR REMOVING CONTAMINANT PARTICLES RELATIVE TO AN ION BEAM

TECHNICAL FIELD

The present invention generally relates to ion beam processing and, more particularly, to a system and method for removing contaminant particles relative to an ion beam.

BACKGROUND

In the manufacture of semiconductor devices, an ion implanter is employed to dope a semiconductor wafer or glass substrate with impurities. In particular, ion beam implanters are used to treat silicon wafers with an ion beam, in order to produce n or p type extrinsic materials doping or to form passivation layers during fabrication of an integrated circuit. When used for doping semiconductors, an ion beam implanter injects a selected ion species to produce a desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway is evacuated to reduce the probability of ions being deflected from the predetermined beam path as a result of collisions with air molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made extremely pure since ions of undesirable molecular weight are deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway, which effectively separates ions of different charge-to-mass ratios.

The ion beam is focused and directed at a desired surface region of the substrate. Typically, the energetic ions of the ion beam are accelerated to a predetermined energy level to penetrate into the bulk of a workpiece. The ions are embedded into the crystalline lattice of the material to form a region of desired conductivity, with the beam energy determining the depth of implantation. Examples of ion implantation systems include those available from Axcelis Technologies of Beverly, Massachusetts.

Operation of an ion implanter or other ion beam equipment (e.g., linear accelerators) may result in the production of contaminant particles. The contaminant particles, for example, may be less than about 1 μm in size. The momentum of the ions in the beam that strike the particles, in turn, cause the particles to be transported with the beam, although typically at a speed much less than the ions. Consequently, particles entrained in an ion beam may be transported with the beam toward the wafer (or other substrate), resulting in undesired contamination at the wafer.

In an ion implantation system, for example, one source of contaminant particles is photoresist material. Photoresist material is coated on wafer surfaces prior to implantation and is utilized to define circuitry on the completed integrated circuit. As ions strike the wafer surface, particles of photoresist coating may be dislodged from the wafer and may become entrained in the ion beam. Contaminant particles that collide with and adhere to a semiconductor wafer or other substrate during ion implantation may be a source of yield loss in the fabrication of semiconductor and other devices that require submicroscopic pattern definition on the treated wafers.

As semiconductor devices are manufactured at reduced sizes with greater precision, higher accuracy and efficiency are required of apparatuses for manufacturing such semiconductor devices. Accordingly, it is desirable to reduce the level of contaminant particles in an ion beam so as to mitigate wafer contamination.

SUMMARY

One aspect of the present invention relates to a system and method for facilitating removal of contaminant particles relative to an ion beam. An ion beam travels through a region in which particles are charged to a polarity different from that of the ion beam. An electric field is generated downstream relative to where the particles are charged, the electric field urging contaminant particles traveling with the ion beam away from a direction of travel of the ion beam. The electric field also may provide an acceleration region for accelerating the ion beam to a desired level. As a result, particles may be removed or urged away from a direction of travel for an ion beam, in accordance with the present invention, thereby mitigating contamination of a workpiece.

Another aspect of the present invention provides a system for inhibiting transport of particles with an ion beam. The system includes a particle charging system for charging particles to a polarity different from that of the ion beam. An electric field generator generates an electric field downstream relative to the particle charging system for urging a charged particle located in the ion beam away from a direction of travel for the ion beam.

Yet another aspect of the present invention provides a system for inhibiting transport of particles with an ion beam. The system includes a plasma generator for emitting plasma into a plasma region that generally surrounds the ion beam. An electric field generator generates an electric field generally parallel to a direction of travel for the ion beam and downstream relative to the plasma region. Particles located in the plasma region are charged negatively, with the electric field urging negatively charged particles located in the ion beam away from the direction of travel for the ion beam.

Another aspect of the present invention provides an ion implantation system. The system includes an ion source for emitting ions to treat a substrate located at an implantation station and an analyzing magnet system for diverting ions of a desired mass to an implantation trajectory. A particle removal system inhibits transport of particles with the diverted ions from the analyzing magnet system. The particle removal system includes a particle charging system for charging particles to a polarity different from that of the diverted ions. An electric field is generated downstream relative to the particle charging system. The electric field is operable to urge at least some of the charged particles away from a direction of travel for the diverted ions. A substrate is supported at the implantation station for treatment with ions from the particle removal system, whereby particle contamination at the substrate is mitigated.

Still another aspect of the present invention provides a method for inhibiting transport of particles with an ion beam. The method includes charging particles to a polarity different from the ion beam and generating an electric field downstream relative to a region in which the particles are charged. At least some of the charge particles are urged away from a direction of travel for the ion beam.

Another aspect of the present invention provides a method for inhibiting transport of particles with an ion beam. The method includes emitting electrons into a region through which the ion beam travels for negatively charging particles. An electric field is generated that is operable to urge the charged particles away from a direction of travel for the ion beam.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DESCRIPTION OF THE INVENTION

The present invention provides a system and method for removing contaminant particles relative to an ion beam, such as may be utilized in conjunction with an ion implanter system. It will be appreciated, however, that the present invention may have broader applications than for use with an ion implanter; the present invention may be employed to help remove contaminant particles from an ion beam in applications other than those described herein. Moreover, while the examples illustrated and described with respect to FIGS. 1–5 mainly disclose removing particles from a positive ion beam, those skilled in the art will understand and appreciate that the present invention is equally applicable to removing particles from a negative ion beam.

Figure 1:
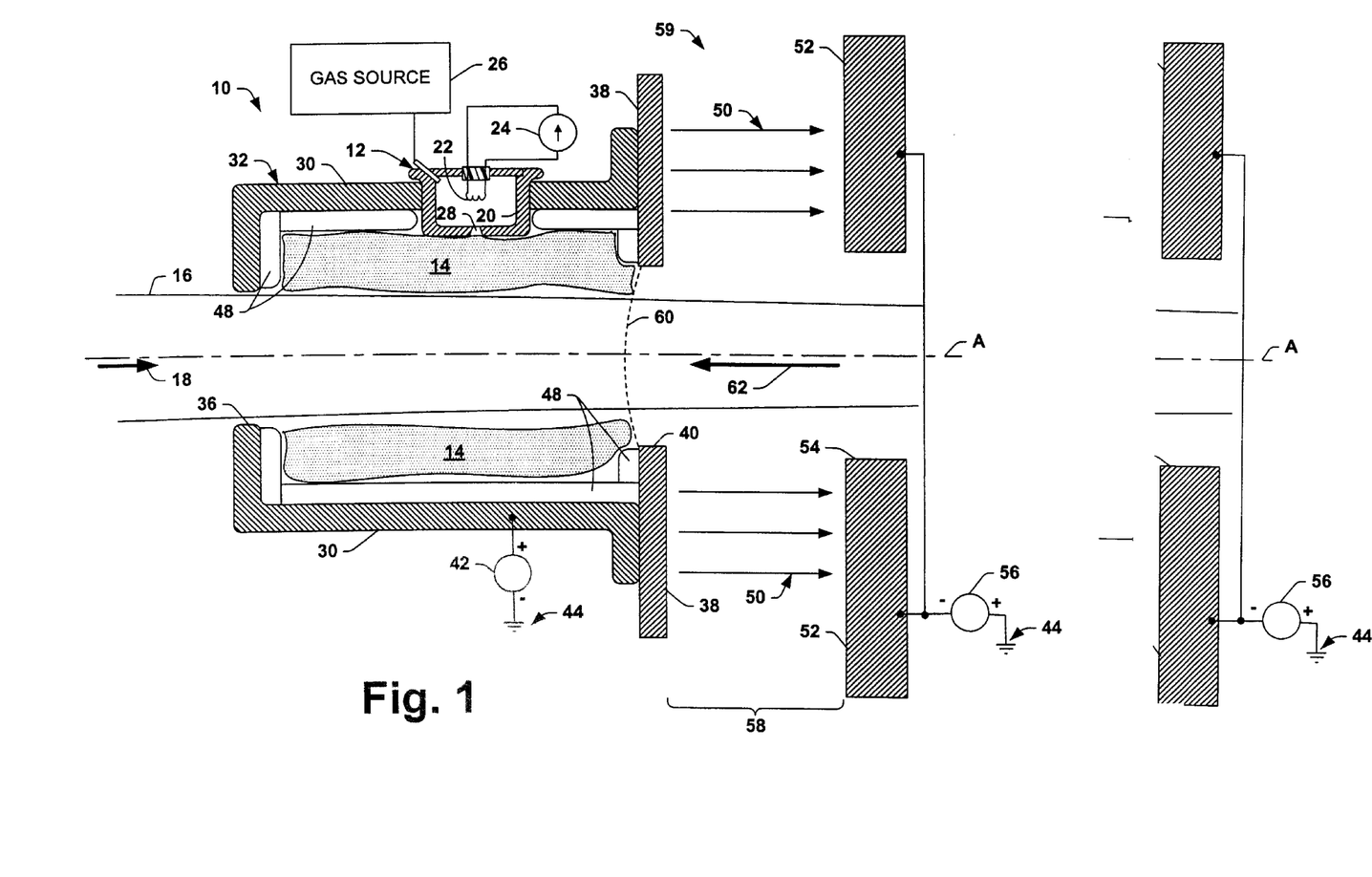
FIG. 1 is a side sectional view of a particle removal system in accordance with the present invention.

FIG. 1 illustrates a particle removal system 10 in accordance with an aspect of the present invention. The system 10 includes a plasma generator 12 that emits electrons and ions to form a plasma sheath 14, through which an ion beam 16 travels. The ion beam 16, which has a beam axis A; travels downstream in a beam direction indicated at 18. The ion beam 16 is formed of, for example, positively charged ions that produce a positive electric field. Consequently, a boundary is formed between the ion beam 16 and the plasma sheath 14, such that the plasma sheath generally surrounds the ion beam. The plasma sheath 14 provides an environment that causes. contaminant particles to, accumulate a negative charge when in the plasma region located outside of the ion beam.

By way of example, the plasma generator 12 may be a plasma electron flood (PEF) system. The PEF system includes an electrically conductive housing 20 electrically separated from an electrically conductive coil 22 located in the housing. The coil 22, which may be formed of tungsten or another suitable material, is energized by providing high current through the coil 22, such as from a current source 24. The current source 24 provides the current through an electrically insulating material to the coil 22. The current through the coil 22 generates a large amount of heat so as to energize electrons within the housing 20. The energization of electrons within the housing 20, in turn, creates an arc of electrons from the coil to the housing. The coil 22 may have a voltage potential of, for example, about 20–25 volts relative to the housing 20, which may be at about 40 kV relative to an electrical ground potential.

A source 26 of an appropriate gas material is operatively connected to the housing 20 for injecting the gas into the housing. While the gas source 26 is schematically illustrated as being connected to an upper end of the housing 20, those skilled in the art will understand and appreciate that gas may be injected into a sidewall of the housing, such as through an appropriate conduit that is in fluid communication with the interior of the housing.

The arc generated between the coil 22 and the housing 20 causes electrons to "boil off" (e.g., be dislodged) from the molecules of the gas provided by the source 26. As a result, the housing 20 fills with electrons and ions of the injected gaseous medium, e.g., plasma. An aperture 28 extends through the housing 20 so that the generated plasma may flow from an interior region of the housing through the aperture 28 at an orientation substantially perpendicular to the path of the ion beam 16. The emitted plasma, in turn, forms a high density plasma sheath 14 with electrons moving faster than the ions in the beam, which causes particles to assume a negative charge.

In the example illustrated in FIG. 1, the plasma generator 12 is mounted in a generally cylindrical sidewall 30 of an electrically conductive terminal electrode 32. The sidewall 30 of the terminal electrode 32 may be substantially coaxial relative to the beam axis A. The terminal electrode 32 has an entry aperture 36 at an upstream end thereof, through which the beam 16 enters into an interior region of the terminal electrode. The terminal electrode 32 also includes an electrically conductive annular plate 38 mounted at a downstream end of the terminal electrode. The annular plate 38 includes an exit aperture 40 through which the ion beam 16 may exit the terminal electrode 32.

The terminal electrode 32 is electrically coupled to a power source 42 that energizes the sidewall 30 of the electrode to a positive voltage potential relative to an electrical ground potential 44 (e.g., about 40 kV). The plasma sheath 14 substantially fills an interior region of the terminal electrode 32 generally surrounding the ion beam 16. In order to help maintain a desired high density of electrons in the interior region of the terminal electrode 32, one or more permanent magnets 48 may be positioned along an interior surface of the terminal electrode. The magnets 48-create a magnetic field along the inner surface of the terminal electrode 32 that control electron loss to the interior wall of the terminal electrode control, thereby increasing the plasma density within the terminal electrode. The plasma sheath 14 advantageously tends to neutralize space charge caused by the ion beam 16 in the terminal electrode region, thereby improving beam stability.

An electric field 50 is generated downstream relative to the terminal electrode 32 for urging negatively charged particles and plasma 14 away from the beam direction 18. By way of example, an electrode 52, which may be a variable resolving electrode located downstream relative to the terminal electrode 32, generates the electric field 50. The electrode 52 includes an aperture (e.g., a variable resolving aperture) 54 through which the ion beam 16 passes. A power source 56 is electrically coupled to the electrode 52 for placing the electrode at a low voltage potential relative to the terminal electrode 32. In particular, the annular plate 38, which is electrically coupled at a downstream end of the terminal electrode 32, operates as an electrode in conjunction with the electrode 52 to form an acceleration system 59. The acceleration system 59 accelerates ions traveling in the ion beam 16 to a desired level according to the strength and direction of the electric field 50. For example, the plate 38 and electrode 52 both may be oriented substantially perpendicular to the beam axis A so as to orient the electric filed substantially parallel to the beam axis. The electrode 52 also may be at a voltage potential of about −40 KV relative to the voltage of the electrode 38 so as to provide a large acceleration gap 58 for accelerating ions in the ion beam 16.

The electric field 50 also operates to form a boundary 60 between the plasma and the electric field. In particular, the electric field 50 exerts a force on electrons and negatively charged particles in a direction (indicated at 62) that is substantially opposite to the direction of beam travel 18. Consequently, the electric field 50 inhibits downstream travel of the plasma sheath 14 through the exit aperture 40 (e.g., the field extinguishes the plasma sheath 14). The field also exerts a force on ions in the beam 16 in a downstream direction, which accelerates the ions accordingly.

The abruptness of the boundary 60 varies as a function of the strength of the electric field 50 relative to the field associated with the plasma 14. A more abrupt or sharper boundary may be provided by increasing the plasma density and/or by decreasing the electric field strength 50 for a given plasma density provided by the plasma generator 12. A sharper plasma boundary 60, in turn, improves the capacity to repel contaminant particles away from the direction of beam travel 18.

While the absence of the plasma 14 in the ion beam 16 may create an environment that tends to positively charge contaminant particles, it is possible that a particle negatively charged by the plasma may not accumulate a net positive charge prior to reaching the boundary 60. Accordingly, particles usually remain negatively charged as they reach the boundary 60, so that the electric field 50 repels negatively charged particles away from the beam travel direction 18.

It is to be understood and appreciated that other systems may be employed (alternatively and/or additionally) to provide a desired charged region upstream relative to a downstream electric field so as to urge contaminant particles away from the beam direction, in accordance with an aspect of the present invention. By way of example, an electron shower or a system for introducing microwave power may be utilized for creating a negative high electronic flux to charge particles to prior to entering the acceleration gap 58.

Figure 2:
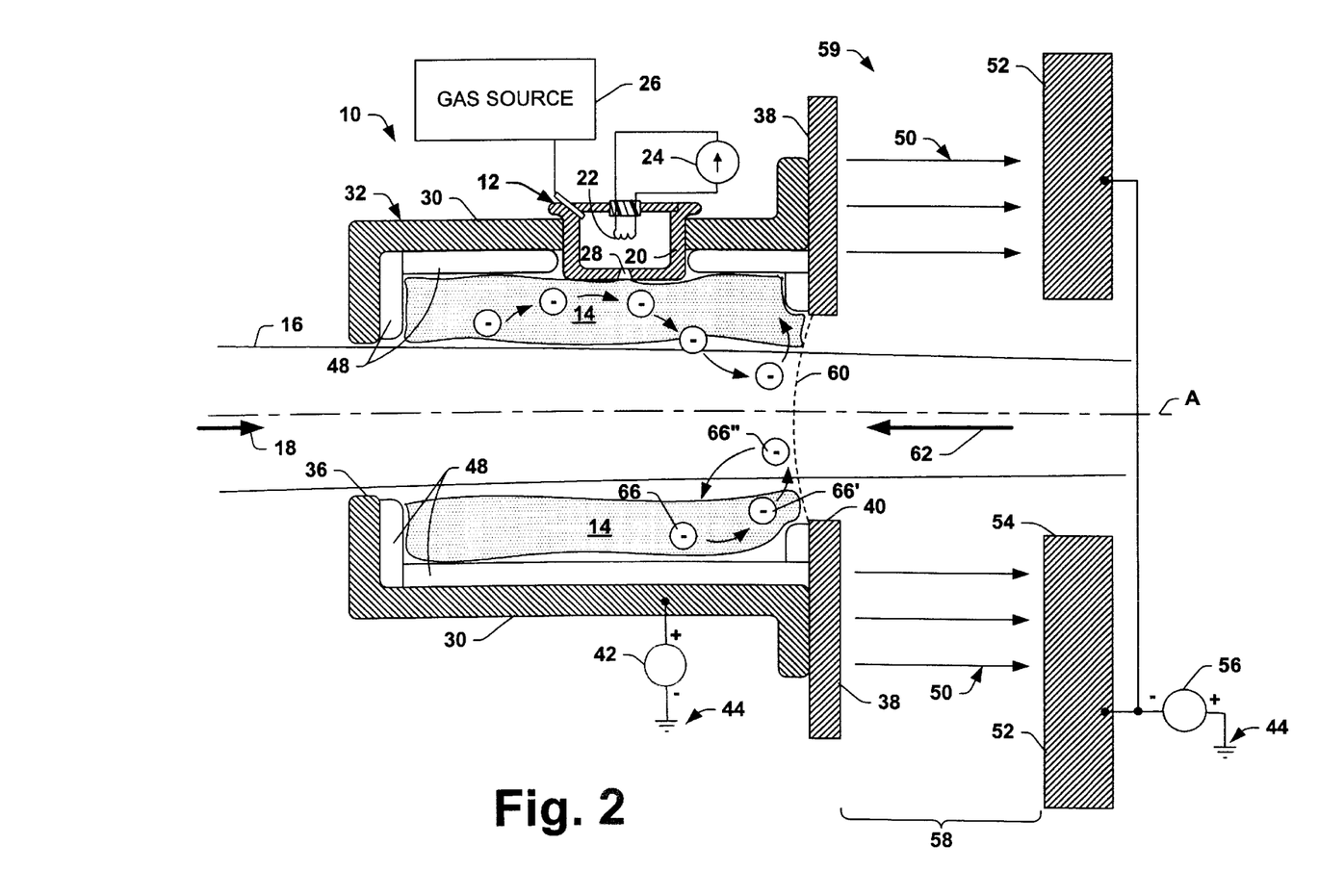
FIG. 2 is another view of the system of FIG. 1, illustrating an example of a particle trajectory in accordance with the present invention.

FIG. 2 illustrates an example of a trajectory for a particle 66 in the system 10 of FIG. 1, in which identical reference numbers refer to parts previously identified with respect to FIG. 1. Particles typically travel in the ion beam 16 at speeds that are several orders of magnitude slower than the ions of the beam. Consequently, movement of particles with the beam 16 is due, at least in part, to the transfer of momentum from the ions of the beam to the particle 66 and to the particle's own kinetic energy.

By way of example, a particle 66 begins its trajectory at a location within the plasma sheath 14 outside of the ion beam 16. In the high density plasma sheath 14, numerous free electrons move with a higher velocity than the ions in the beam 16 so that the particle 66 tends to have a high collision rate with electrons. As a result, the particle 66 accumulates a relatively large negative charge while in the plasma sheath 14. Kinetic energy of the particle 66' carries it into the ion beam 16, and the momentum of the ions urges the particle 66' in the beam direction 18 toward the boundary 60.

After the particle 66" enters the ion beam 16 (which is substantially plasma free), the ions of the beam 16 tend to collide with the particle. While the absence of the plasma 14 within the ion beam 16 may create an environment in which the ions tend to positively charge the particle, it is possible that a particle will not become positively charged prior to reaching the boundary 60. This is because the particle accumulates a large negative charge while located in the plasma sheath 14. Thus, the particle 66" usually maintains a net negative charge prior to reaching the boundary 60 (although it may be less negative in the ion beam than when in the plasma sheath).

As illustrated in the example in FIG. 2, the particle 66" is urged away from the direction of beam travel 18 and out of the beam 16. In particular, the electric field 50 exerts a force in the direction of the arrow 62 on the particle 66" so as to deflect the particle out the beam 16 in accordance with an aspect of the present invention. The ion beam 16 may then continue through the boundary, with the electric field 50 exerting a force on the ions in the direction of beam travel 18, thereby accelerating the beam by an amount functionally related to the strength of the electric field.

In view of the foregoing structure shown and described with respect to FIG. 2, it is to be appreciated that the present invention provides a system 100 for helping to remove contaminant particles from an ion beam 16. The system 100 employs a region, which may substantially surround the ion beam 16, for charging contaminant particles 66 to a charge having a polarity opposite that of the ion beam. The particles 66 may travel from the ion beam 16 into the plasma sheath 14 through their own kinetic energy. The particles 66 accumulate a corresponding charge while located in the plasma sheath 14 and, in turn, may enter the ion beam 16, such as in response to colliding with one of the magnets 48 or another structure. The ions in the beam 16 collide with the particles, moving them toward the boundary 60. The electric field 50 operates to urge the particles away from the direction of beam travel 18, thereby helping to remove contaminant particles from the ion beam. Moreover, if a particle 66 travels downstream through the boundary, the particle likely will still be urged away from the direction of travel so as not to collide with a downstream workpiece or substrate.

Figure 3:
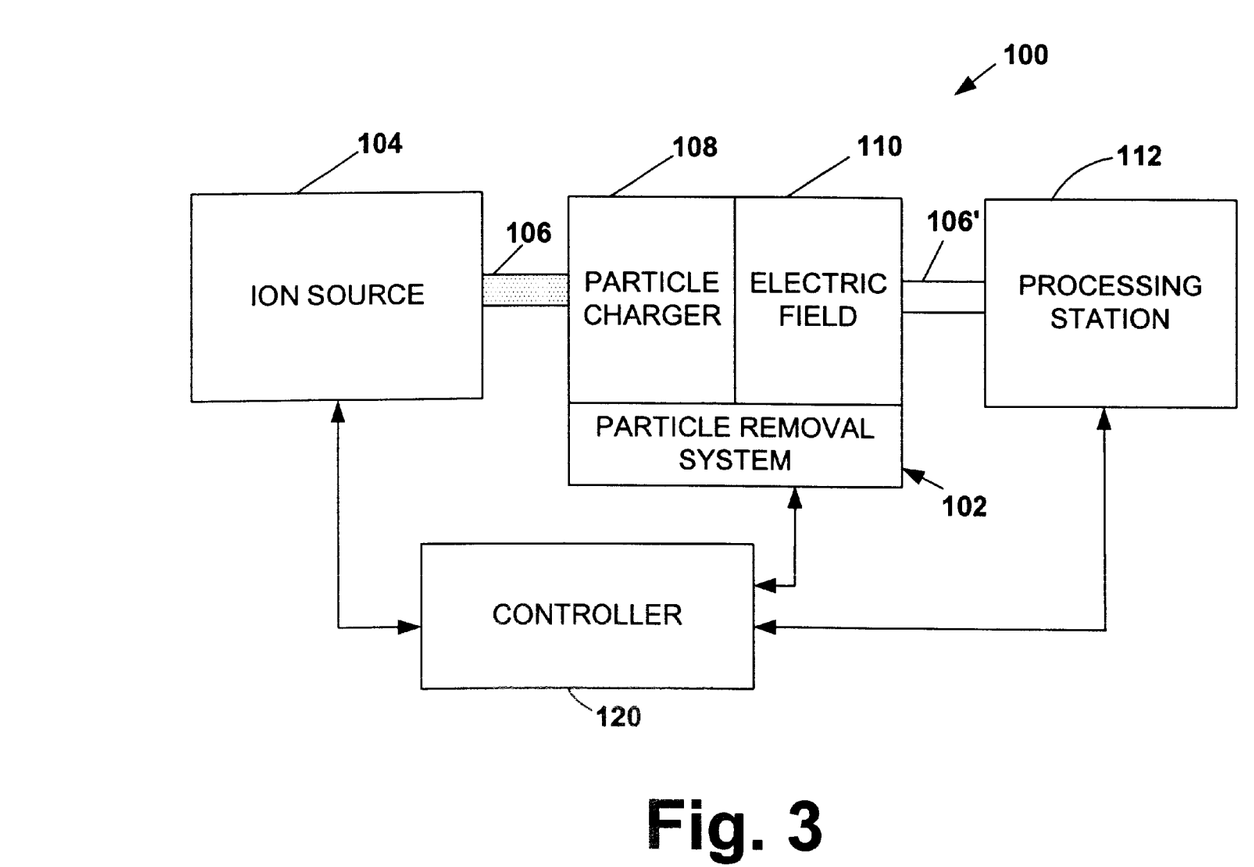
FIG. 3 is a schematic block representation of an ion implantation system employing a particle removal system in accordance with the present invention.

In order to provide context for the present invention, FIG. 3 is a functional block representation of an ion beam processing system 100 employing a particle removal system 102 in accordance with an aspect of the present invention. By way of example, the system 100 may be an ion implantation system, a particle accelerator, or other system employing an ion beam (positive or negative) in which it may be desirable to remove and/or divert contaminant particles away from a direction of beam travel.

The system 100 includes an ion source 104 that emits ions that form an ion beam 106. The ion source 104, for example, includes a chamber into which source materials, such as an ionizable gas or vaporized materials, are injected. Energy is applied to the source materials to generate ions that, in turn, exit the chamber to form the ion beam 106 (positive or negative). Ion sources are well known to those skilled in the art and details concerning such sources are, therefore, omitted for sake of brevity. An example of an ion source that employs microwave energy to ionize source materials is disclosed in U.S. Pat. No. 5,523,652, which is incorporated herein by reference. Those skilled in the art will understand and appreciate that a particle removal system 102 in accordance with an aspect of the present invention may be utilized in conjunction with other types of ion sources, which may or may not undergo additional processing.

In accordance with an aspect of the present invention, the ion source 104 provides the ion beam 106 to the particle removal system 102. The particle removal system 102 employs a region 108 for charging a particle to a polarity that is different from the polarity of the ion beam. The particle charging region 108 operates in conjunction with a downstream electric field 110 to facilitate removal of contaminant particles entrained in the ion beam 106. In particular, the electric field 110 exerts a force on the charged particles to urge them away from the direction of beam travel while also exerting a force (in the opposite direction) on the ions in the ion beam to accelerate them in the direction of beam travel.

By way of example, the particle charging region 108 includes a high density plasma, mostly electrons in a gaseous medium, through which the ion beam travels. The plasma may be generated by any known plasma generator system. Injecting electrons or increasing the plasma density within the particle charging region may be utilized to enhance the particle charging. The plasma may be provided in a direction substantially perpendicular to the beam direction.

The downstream electric field 110 extinguishes (or blows off) the plasma sheath to establish a boundary (or barrier) between the particle charging region and region of the electric field. The electric field 110, for example, is generated in a direction substantially parallel to the direction of beam travel for accelerating the ion beam to a desired level. The electric field 110 also exerts a force on negatively charge particles and the electrons in the plasma to urge them away from the direction of beam travel. The more negative a particle becomes and/or the greater the strength of the electric field, the greater the particle deflection relative to the ion beam 106. As a result, the boundary inhibits transport of contaminant particles with an accelerated ion beam 106' as the beam exits the particle removal system 102.

The particle removal system 102 may provide the beam 106' to a processing station 112. By way of example, the processing station 112 may be an implantation station (for ion implantation), an analysis station (for substrate analysis), or other systems that may employ an ion beam.

A controller 120 may be operatively associated with each of the ion source 104, the particle removal system 102, and the processing station 112. The controller 120 may monitor and control the ion beam characteristics provided to the processing station 112. The controller 120 may be formed of hardware and/or software programmed and/or configured to implement desired control functionality with respect to the various parts of the system 100 to control parameters of the ion beam 106.

Figure 4:
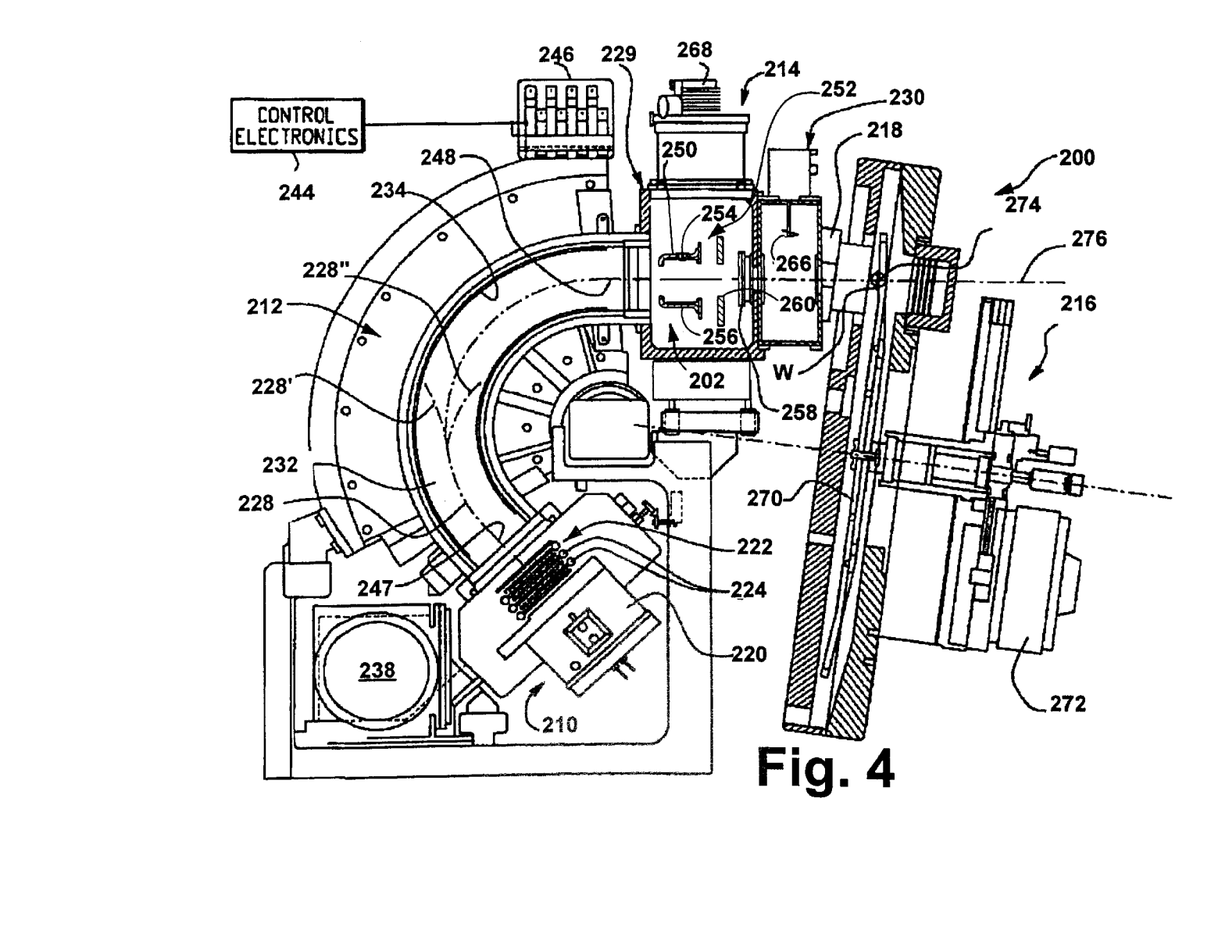
FIG. 4 is a partial sectional view of an example of an ion implantation system employing a particle removal system in accordance with the present invention.

In order to provide additional context for the present invention, FIG. 4 illustrates an example of an ion implantation system 200 configured to employ a particle removal system 202 in accordance with an aspect of the present invention. The ion implantation system 200 includes an ion source 210, a mass analysis magnet 212, a beamline assembly 214, and a target or end station 216. An expansible stainless steel bellows assembly 218, which permits movement of the end station 216 with respect to the beamline assembly 214, connects the end station 216 and the beamline assembly 214. Although FIG. 4 illustrates an example of an ultra low energy (ULE) ion implantation system, a particle removal system, in accordance with the present invention, has applications in other types of implanters as well.

The ion source 210 includes a plasma chamber 220 and an ion extractor assembly 222. Energy is imparted to an ionizable dopant gas to generate ions within the plasma chamber 220. Generally, positive ions are generated, although the present invention is applicable to systems wherein negative ions are generated by the source 210. The positive ions are extracted through a slit in the plasma chamber 220 by the ion extractor assembly 222, which comprises a plurality of electrodes 224. The electrodes 224 are charged with negative potential voltages, increasing in magnitude as the distance from the plasma chamber slit increases. Accordingly, the ion extractor assembly 222 functions to extract a beam 228 of positive ions from the plasma chamber 220 and to accelerate the extracted ions into the mass analysis magnet 212.

The mass analysis magnet 212 functions to pass ions having an appropriate charge-to-mass ratio to the beamline assembly 214, which comprises a resolving housing 229 and a beam neutralizer 230. The mass analysis magnet 212 includes a curved beam path 232 defined by an aluminum beam guide 234 having arcuate cylindrical side walls, evacuation of which is provided by a vacuum pump 238. The ion beam 228 that propagates along this path 232 is affected by the magnetic field generated by the mass analysis magnet 212 to reject ions of an inappropriate charge-to-mass ratio. The strength and orientation of this dipole magnetic field is controlled by control electronics 244, which adjust the electrical current through the field windings of the magnet 212 through a magnet connector 246.

The dipole magnetic field causes the ion beam 228 to move along the curved beam path 232 from a first or entrance trajectory 247 near the ion source 210 to a second or exit trajectory 248 near the resolving housing 229. Portions 228' and 228" of the beam 228 (comprised of ions having an inappropriate charge-to-mass ratio) are deflected away from the curved trajectory and into the walls of an aluminum beam guide 234. In this manner, the magnet 212 passes to the resolving housing 229 only those ions in the beam 228 that have the desired charge-to-mass ratio.

By way of example, the particle removal system 202 is positioned in the resolving housing 229, although it is to be appreciated that the system may, in accordance with the present invention, be located in other parts of the ion implantation system 200. For example, the particle removal system 202 may be located at a downstream end of the beam guide 234.

The particle removal system 202 facilitates removal of contaminant particles by providing a particle charging region 250 in conjunction with a downstream electric field generator 252 that generates an electric field, which urges charged contaminant particles away from the ion beam 228. The particle removal system 202 illustrated in FIG. 4 may be substantially identical to that shown and described with respect to FIG. 1. Briefly stated, the particle charging region 250 includes a plasma generator 254 mounted in an elongated and generally cylindrical sidewall of a terminal electrode 256. The plasma generator 254 generates plasma that forms a plasma sheath through which the ion beam 228 travels (the plasma generally surrounds the ion beam within an interior region of the terminal electrode 256).

The electric field is generated between the terminal electrode 256 and a downstream electrode 260, which field is oriented in a direction substantially parallel to the direction of beam travel. Particles located within the plasma sheath accumulate a charge having a polarity (e.g., negative) that is different from that of the ion beam 228 (e.g, positive). The electric field exerts a force on the charged particles to urge them away from the direction of beam travel. Because the ions in the beam 228 have opposite polarity relative to the particles, the electric field exerts a force on the ions (in the opposite direction of the force on the charged particles) to accelerate them in the direction of beam travel. As a result, the particle removal system 202 performs a dual function; it urges contaminant particles away from the direction of beam travel as well as accelerates the ion beam 228.

The beam neutralizer 230 may include a plasma shower 266 for neutralizing the positive charge that may accumulate on the target wafer as a result of being implanted by the positively charged ion beam 240. The beam neutralizer 230 and resolver housing 229 are evacuated by a vacuum pump 268. It is to be appreciated by those skilled in the art that a separate beam neutralizer 230 may not be necessary in view of the space charge neutralization provided by the plasma sheath in the particle removal system 202, in accordance with an aspect of the present invention.

Downstream of the beam neutralizer 230 is the end station 216, which includes a disk-shaped wafer support 270 upon which wafers to be treated are mounted. The wafer support 270 resides in a target plane, which is generally perpendicularly oriented relative to the direction of the implant beam. A motor 272 rotates the disc shaped wafer support 270 at the end station 216. The ion beam thus strikes wafers mounted to the support as they move in a circular path. The end station 216 pivots about point 274, which is the intersection of the path 276 of the ion beam and the wafer W, so that the target plane is adjustable about this point.

Figure 5:
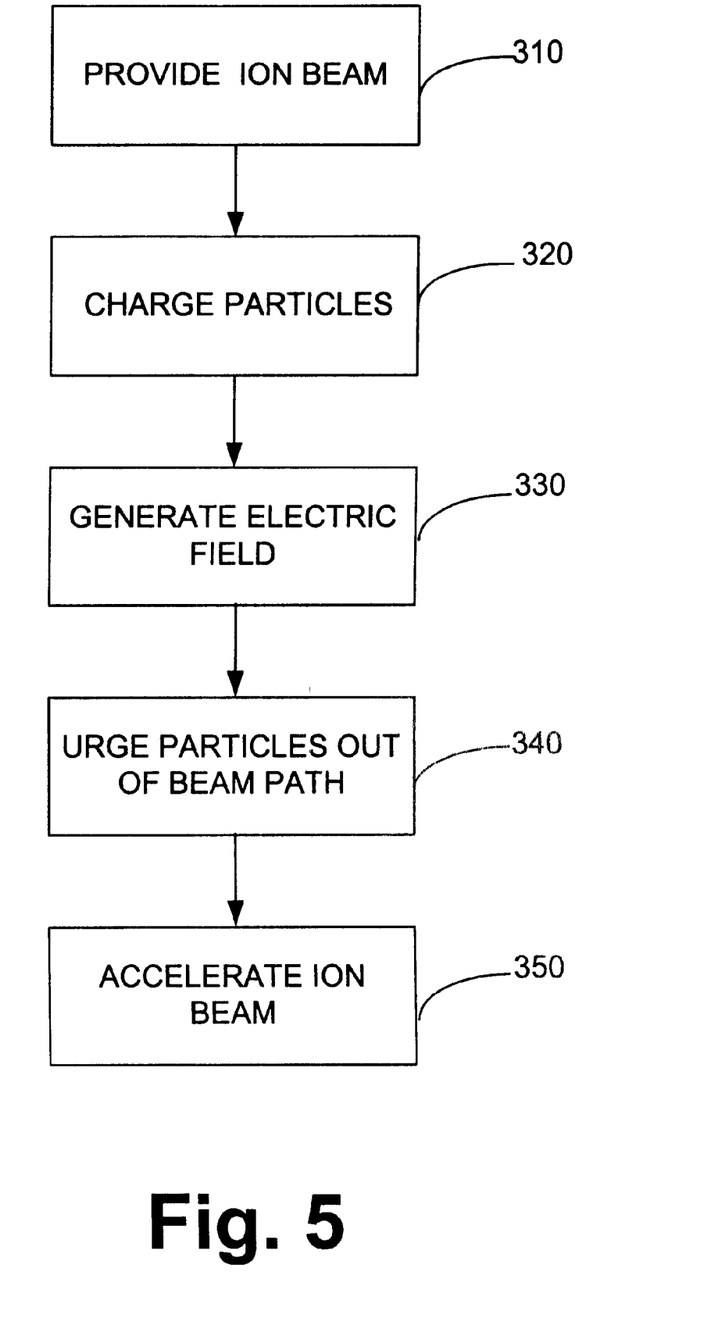
FIG. 5 is a flow diagram illustrating a methodology for inhibiting the transport of particles with an ion beam in accordance with the present invention.

FIG. 5 is a flow diagram illustrating an example of a methodology for inhibiting particle transport in an ion beam in accordance with an aspect of the present invention. While, for purposes of simplicity of explanation, the methodology of FIG. 5 is shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect of the present invention.

Referring to FIG. 5, the illustrated methodology begins at step 310, in which an ion beam is provided. The ion beam may be a positive or negative ion beam. For sake of brevity, the following methodology will be described with respect to a positive ion beam.

At step 320, contaminant particles are negatively charged (a polarity opposite that of the ion beam). By way of example, the charging may occur due to collisions with electrons in a high density plasma sheath, which may be located in a region generally surrounding the ion beam as described herein. It is to be appreciated that negative electrons also may be provided to charge contaminant particles, such as by a system for generating an electron shower or a microwave power system. From step 320, the process proceeds to step 330.

A step 330, an electric field is generated downstream relative to where the particles are charged. The electric field may be generated in a direction generally parallel to the path of an ion beam. A boundary is established between the negatively charged plasma sheath and the electric field due to the electric field exerting forces on the plasma in a direction substantially opposite the direction of beam travel. As the charged contaminant particles enter the ion beam, the momentum of the ion beam carries the particles toward the plasma boundary. The electric field exerts a force on the charged particles (similar to that exerted on the plasma) to urge them away from the direction of beam travel (step 340). The electric field also exerts a force on the ions in the ion beam to accelerate them (step 350) in the direction of beam travel.

Although the invention has been shown and described with respect to a certain embodiments, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary embodiments of the invention. In this regard, it will also be recognized that the invention includes a computer-readable medium having computer-executable instructions for performing the steps of the various methods of the invention. In addition, while a particular feature of the invention may have been disclosed with respect to only one of several embodiments, such feature may be combined with one or more other features of the other embodiments as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising."

What is claimed is:

1. A system for inhibiting transport of particles with an ion beam comprising:
    a particle charging system for charging particles to a polarity that is different from that of the ion beam; and
    an electric field generator for generating an electric field downstream relative to the particle charging system, the electric field being operable to urge a charged particle located in the ion beam away from a direction of travel for the ion beam.

2. The system of claim 1, wherein the electric field generator generates the electric field in a direction substantially parallel to the direction of travel for the ion beam, the electric field accelerating the ion beam in the direction of travel for the ion beam.

3. The system of claim 1, wherein the particle charging system further includes an electron generating system for supplying electrons into a region through which the ion beam travels, the electrons negatively charging the particle.

4. The system of claim 3, wherein the electron generating system further includes a plasma electron flood system that emits electrons into the region for negatively charging the particle, the electric field exerting forces on the electrons and the negatively charged particle to urge the electrons and the negatively charge particle away from the direction of travel for the ion beam.

5. The system of claim 4, wherein the particle charging system includes an elongated sidewall portion having an inner surface that defines the region, the system further including at least one permanent magnet located at the inner surface of the sidewall portion for increasing density of electrons throughout the region.

6. The system of claim 1, wherein the electric field generator further includes first and second electrodes that are spatially separated and oriented relative to each other so that the electric field is substantially aligned with the direction of travel for the ion beam.

7. The system of claim 6, wherein the electric field is operable to exert a force on ions in the ion beam to accelerate the ions to a desired level.

8. A system for inhibiting transport of particles with an ion beam comprising:
  a plasma generating system for providing plasma into a plasma region that generally surrounds the ion beam; and
  an electric field generator for generating an electric field generally parallel to a direction of travel for the ion beam and downstream relative to the plasma region;
  wherein particles located in the plasma region are charged negatively, the electric field urging negatively charged particles located in the ion beam away from the direction of travel for the ion beam.

9. The system of claim 8, wherein the electric field generator includes first and second electrodes that are spatially separated from each other, the electric field being substantially aligned with the direction of travel of the ion beam for accelerating ions in the ion beam to a desired level.

10. The system of claim 8 further including at least one magnet located at an outer periphery of the plasma region for increasing density of electrons throughout the region.

11. An ion implantation system comprising:
  an ion source for emitting ions to treat a substrate located at an implantation station;
  an analyzing magnet system for diverting ions of a desired mass to an implantation trajectory;
  a particle removal system for inhibiting transport of particles with the diverted ions from the analyzing magnet system, the particle removal system comprising:
    a particle charging system for charging particles to a polarity different from that of the diverted ions; and
    an electric field located downstream relative to the particle charging system, the electric field being operable to urge at least some of the charged particles away from a direction of travel for the diverted ions; and
  a substrate supported at the implantation station for treatment with ions from the particle removal system, whereby particle contamination at the substrate is mitigated.

12. The system of claim 11, wherein the particle charging system further includes an electron generating system for supplying electrons into a region through which the diverted ions travels.

13. The system of claim 11, wherein the electron generating system further includes a plasma electron flood system that provides electrons into the region to provide a region of high density plasma substantially surrounding a beam formed of the diverted ions, the plasma region charging the particle when located in the plasma to a negative charge, so as to be urged away from the direction of travel for the ion beam by the electric field.

14. The system of claim 13, wherein the particle charging system includes an elongated sidewall portion having an inner surface that defines the region, the system further including at least one permanent magnet located at the inner surface of the sidewall portion for increasing density of electrons throughout the region.

15. The system of claim 13, wherein the first electrode is located upstream relative to the second electrode, the first electrode being operatively connected to a downstream end of the particle charging system.

16. The system of claim 11, wherein the electric field is generated by first and second electrodes that are spatially separated from each other and located downstream relative to the particle charging system, the electric field being substantially aligned with the direction of travel of the ion beam for accelerating the diverted ions to a desired level.

17. A system for inhibiting transport of particles with an ion beam comprising:
  means for charging particles to a charge having a polarity different from that of the ion beam; and
  means for generating an electric field downstream relative to the means for charging;
  wherein the electric field is operable to urge charged particles away from a direction of travel for the ion beam.

18. The system of claim 17 wherein the means for generating the electric field further includes means for accelerating the ion beam in the direction of travel for the ion beam.

19. The system of claim 17 further including means for generating an electric field for facilitating the charging of the particles.

20. A method for inhibiting transport of particles with an ion beam, the method comprising the steps of:
  charging particles to a charge having a polarity different from that of the ion beam;
  generating an electric field downstream relative to a region in which the particles are charged; and
  using the electric field to urge at least some of the charge particles away from a direction of travel for the ion beam.

21. A method for inhibiting transport of particles with an ion beam, the method comprising the steps of:
  emitting electrons into a region through which the ion beam travels for negatively charging particles;
  generating an electric field operable to urge the charged particles away from a direction of travel for the ion beam, wherein the step of generating the electric field further includes accelerating the ion beam in the direction of travel for the ion beam downstream of the electron-emitting region.

22. The method of claim 21, wherein the step of generating the electric field further includes generating the electric field substantially parallel to the direction of the travel for the ion beam.

23. The method of claim 21 further including the step of generating a magnetic field near an outer boundary of the region for improving the density of electrons in the region.

* * * * *

UNITED STATES PATENT AND TRADEMARK OFFICE
CERTIFICATE OF CORRECTION

PATENT NO.    : 6,476,399 B1
DATED         : November 5, 2002
INVENTOR(S)   : Eric R. Harrington et al.

It is certified that error appears in the above-identified patent and that said Letters Patent is hereby corrected as shown below:

Drawings,
Sheet 1 of 5, Fig. 1 in the drawings, please eliminate the partial drawing on the top of the page. A corrected sheet is attached.

Column 5,
Line 29, please replace the word "filed" with the word -- field --.

Column 7,
Line 52, please replace the word "charge" with the word -- charged --.

Column 10,
Line 11, please replace the word "A" with the word -- At --.
Line 27, please delete the word "a" before the word "certain".

Signed and Sealed this

Thirteenth Day of May, 2003

JAMES E. ROGAN
*Director of the United States Patent and Trademark Office*

Fig. 1